US 10,979,272 B2

(12) United States Patent
Reimann

(10) Patent No.: US 10,979,272 B2
(45) Date of Patent: Apr. 13, 2021

(54) METHOD FOR IMPROVING TRANSIT TIME AND/OR PHASE MEASUREMENT

(71) Applicant: Lambda:4 Entwicklungen GmbH, Hamburg (DE)

(72) Inventor: Rönne Reimann, Hamburg (DE)

(73) Assignee: Lambda:4 Entwicklungen GmbH, Hamburg (DE)

( * ) Notice: Subject to any disclaimer, the term of this patent is extended or adjusted under 35 U.S.C. 154(b) by 12 days.

(21) Appl. No.: 16/389,204

(22) Filed: Apr. 19, 2019

(65) Prior Publication Data

US 2019/0334752 A1    Oct. 31, 2019

(30) Foreign Application Priority Data

Apr. 30, 2018   (EP) .................................... 18170172

(51) Int. Cl.
| | |
|---|---|
| *H04L 27/26* | (2006.01) |
| *G01S 7/4865* | (2020.01) |
| *G01S 17/10* | (2020.01) |
| *H03M 1/12* | (2006.01) |
| *H04L 5/00* | (2006.01) |

(Continued)

(52) U.S. Cl.
CPC ........ *H04L 27/2655* (2013.01); *G01S 7/4865* (2013.01); *G01S 17/10* (2013.01); *H03M 1/12* (2013.01); *H04L 5/003* (2013.01); *H04L 7/041* (2013.01); *H04L 27/2613* (2013.01); *H04L 27/32* (2013.01)

(58) Field of Classification Search
CPC ...... G01S 17/10; G01S 7/4865; G01S 7/4866; G01S 7/487; G01S 7/493; H03M 1/12; H04L 27/2613; H04L 27/2655; H04L 27/32; H04L 5/003; H04L 7/041
See application file for complete search history.

(56) References Cited

U.S. PATENT DOCUMENTS

| 5,745,464 A | 4/1998 | Taguchi et al. |
| 2003/0021186 A1* | 1/2003 | Lyon ................... G01F 23/2962 367/99 |

(Continued)

FOREIGN PATENT DOCUMENTS

| CN | 103792526 | 5/2014 |
| EP | 0895368 | 2/1999 |

(Continued)

*Primary Examiner* — Nader Bolourchi
(74) *Attorney, Agent, or Firm* — Sand, Sebolt & Wernow Co., LPA

(57) ABSTRACT

The invention relates to a method for improving transit time and/or phase measurement and/or for synchronization in digital transmission systems. According to the invention, at least one first, particularly digital, piece of information in at least one first analog signal is transmitted in encoded form between two objects by means of the transmission system and at least one first sample value of the at least one first analog signal is used to determine a temporal position and/or phase relationship. The at least one first sample value lies in a rising or falling edge of the at least one first analog signal and/or of the at least one first received analog signal, which can be recognized, for example, from the sample value itself and/or the characteristic of adjacent sample values.

15 Claims, 3 Drawing Sheets

(51) Int. Cl.
*H04L 7/04* (2006.01)
*H04L 27/32* (2006.01)

(56) References Cited

U.S. PATENT DOCUMENTS

| | | | | |
|---|---|---|---|---|
| 2006/0176082 | A1* | 8/2006 | Johnstone | H03K 5/1252 |
| | | | | 327/1 |
| 2011/0012530 | A1* | 1/2011 | Zheng | H02M 3/33523 |
| | | | | 315/294 |
| 2011/0038442 | A1* | 2/2011 | Ullrich | G01S 7/497 |
| | | | | 375/340 |
| 2012/0257187 | A1* | 10/2012 | Stutz | G01S 7/4865 |
| | | | | 356/5.01 |
| 2016/0349368 | A1* | 12/2016 | Stutz | G01S 7/4865 |
| 2018/0113160 | A1 | 4/2018 | Warburton et al. | |

FOREIGN PATENT DOCUMENTS

| | | |
|---|---|---|
| EP | 1085329 | 3/2001 |
| EP | 1672794 | 6/2006 |
| EP | 3098626 | 11/2016 |
| WO | 2011008635 | 1/2011 |

\* cited by examiner

METHOD FOR IMPROVING TRANSIT TIME AND/OR PHASE MEASUREMENT

TECHNICAL FIELD

Method for improving transit time and/or phase measurement and/or for synchronization in digital transmission systems.

BACKGROUND

Background Information

It is known to use a transit time measurement of the signal for measuring distance. The phase shift or time of flight of a signal is usually measured for this purpose.

It is known from pure distance measuring systems that evaluate the transit time of a signal pulse, for example from EP 3 098 626 A1, to start a signal generator via a comparator upon arrival of the signal that generates a likewise repeated edge and to deduce the time of arrival of the pulse by sampling the edge.

In another field of the art, it is known from US2018/113160 to use the ratio of sample values of a signal pulse of a scintillator and a reference to estimate therefrom the exact temporal position of the pulse-triggering event.

Likewise, in another field of the art, it is known from U.S. Pat. No. 5,745,464 to achieve a correction of the digital data by analyzing the edges of a signal generated during the readout of optical data carriers even under thermal influences in order to read out the data that were originally encoded on the data carrier with maximum accuracy.

Unlike in rangefinders, which utilize the transit time of a pulse generated for transit time measurement in order to determine the distance from the round-trip transit time of the reflected pulse with a direct line of sight, in digital systems that are used for data transmission, the digital data are converted by specific methods into mostly electromagnetic signals for transmission, transmitted, and decoded again at the receiver. Various encoding and/or modulation methods are used for this purpose, sometimes with signal-shaping methods. As a rule, the data are modulated into a low-frequency analog signal, and this signal is then mixed at a higher frequency. At the receiver, the digital data are then extracted again from the high-frequency signal. For this purpose, mixers are generally used to first transform to a low or medium frequency in order to then extract the data. Methods such as PSK (Phase Shift Keying), FSK (Frequency Shift Keying), including in the form of GFSK (Gaussian Frequency Shift Keying) and/or I&Q (In-Phase & Quadrature) or QAM (Quadrature Amplitude Modulation), for example, are used for this purpose.

However, the abovementioned or similar methods for encoding the information are sometimes used even for transmissions over cable or optical fiber.

At the receiver, an analog-to-digital converter is used with the aid of which the digital signals are recovered. The information about the actual analog signal characteristic that was initially obtained with the analog-to-digital converter is usually discarded for the most part in favor of the digital information that was most likely encoded in the analog signal. To this end, numerous techniques are known for influencing and/or shifting the probabilities and for optimizing the transmission reliability and/or the quantity of the data per time and/or per bandwidth.

SUMMARY

However, this is not the object of the invention. Instead, it is the object of the invention to determine the temporal position of the signal and/or the phase relationship of the signal and/or to synchronize times through targeted exploitation of the analog signal that was transmitted for the transmission of data, particularly of payload, or the information that was initially transmitted via the analog signal that was transmitted via a cable, an optical waveguide, and/or wirelessly, for example, particularly with a higher level of accuracy than is possible with existing systems, particularly in the transmission of digital data, and particularly without further increasing the demands on the hardware. This is achieved to special advantage by means of an analog signal in which digital information is encoded, in particular a previously known signal.

For this purpose, in contrast to the procedure in known transmission systems, which generally work with a threshold value decision in order to decode the information from a signal, the invention makes use of the precise signal characteristic in order to determine the position of the received signal, particularly in time. To wit, threshold value decisions show a clear dependence on the sampling rate and/or the position of the samples relative to the signal characteristic, whereas by using the actual value of the sample, a substantially more accurate determination of the position of the signal, particularly in time, is possible.

While the temporal position of the sample value measured against an absolute time or a clock generator at the second object is indeed known through the sampling, the position of the sample value or the sample relative to the signal is not known, because the position—particularly the temporal position—of the signal at the receiver or second object, particularly measured against an absolute time or a clock generator at the second object, can vary and is generally not known.

In existing data transmission systems, an adaptation of (relative) time measurements takes place in in the transmitter and receiver in order to clearly identify when the transmission of an information unit, e.g., a symbol and/or chip, begins and/or ends. The systems are thus usually symbol-synchronized. Although distance measurements can be derived from this, they do not match the capabilities of the analysis according to the invention.

In the Bluetooth standard, a clock is kept for this purpose, and the other communication partners work with an offset to this clock. Each communication partner has its own clock for this purpose which provides a time measurement (not synchronization) with an accuracy of about 3 μs. The CSP mechanism is used for the synchronization, for example. CSP offers a synchronization accuracy of about 1 ms. In general, known transmission systems achieve time synchronization or signal propagation delay measurement with an accuracy corresponding to the symbol rate up to a maximum of one quarter of the symbol rate.

In particular, the methods, uses, and systems according to the invention achieve an accuracy in the analysis of the position, particularly of the temporal position, and transit time measurement of better than one quarter of the symbol and/or chip rate and/or of better than 0.25 ms, and they are configured accordingly.

In order to ensure reliable decoding of a digital data stream in an analog signal in the prior art, the sampling must be carried out in the analog-to-digital converter at a frequency that is substantially higher than the bandwidth of the frequency of the analog signal and/or the bandwidth of the frequency of the signal required for the data transmission, which signal is fed as necessary for sampling in the analog-to-digital converter, optionally after filtering. Analog-to-digital converters usually have upstream, partially integrated filters for this purpose. As a rule, the sampling rate or frequency must be higher by at least a factor of two than the bandwidth of the frequency of the analog signal required for the data transmission and/or the bandwidth of the frequency of the signal, which is fed as necessary for sampling in the analog-to-digital converter, optionally after filtering (Nyquist-Shannon sampling theorem). The sampling rate or frequency is usually at least twice the chip or symbol rate. For example, in the Bluetooth band at 2450 MHz, a maximum output bandwidth of 2 MHz can be expected to be achieved through filtering (GFSK etc.) at the transmitter. At the receiver, sampling is generally performed at a sampling frequency of at least 4 MHz.

With a sampling frequency of 4 MHz, the timepoint of a change in the received signal (for example, a change in amplitude and/or phase, particularly due to a change in the emitted signal) can then be detected directly with only a maximum resolution of 4 MHz.

In practice, however, higher sampling rates are already utilized internally in the chips used, which are higher by a single-digit factor in order to ensure maximally robust transmission.

For Bluetooth, for example, the symbol rate is 1 MHz, with the transmit frequency for logical "1" being 500 kHz above the center frequency, whereas for "0" it is 500 kHz below the center frequency. Mixing is typically performed at the center frequency, i.e., at logical "1" with intermediate frequency plus 500 kHz and at logical "0" with intermediate frequency minus 500 kHz. For a logical "1," the phase rotates by XX° forward, and for logical "0" it rotates XX° backward.

During transmission, however, the frequency is usually not adjusted in steps, as this would lead to a high bandwidth or interference in the secondary channels, but rather a maximally continuous transition is usually carried out by means of GFSK. Advantageously, the signal characteristic is usually smoothed in the receiver upstream from the mixer by filters before the ND sampling. The invention makes use of just such a signal characteristic.

If the characteristic of the transmitted, received, or emitted analog signal is at least approximately known at least in part, it is possible to achieve a substantially higher level of accuracy in the analysis of the temporal position of the signal or of the edge, the phase relationship, and/or the transit time measurement by evaluating this analog signal characteristic, particularly of an edge of the signal, for example of the increase in amplitude, and exploiting the sampling rate that is necessary and/or used anyway, and thereby also achieve a much more accurate synchronization as well, e.g., time synchronization between transmitter and receiver, and a more accurate measurement of the signal transit time, particularly more accurate by a factor of between 2 and 16 usually without changing the hardware, which depends on the hardware used, particularly on the ratio of the bandwidth to the sampling rate and the resolution (bit depth) of the sampling.

The object is achieved particularly by a method for analyzing the position, particularly the temporal position and/or phase relationship of the analog signal, particularly for transit time measurement, phase measurement, or synchronization, in a particularly digital transmission system.

The temporal position and phase relationship of a signal can usually be converted into one another or a fixed relationship established therebetween, and transit time measurements, measurements of the phase shift, or synchronizations can generally be carried out on the basis of the temporal position or phase relationship. It is also usually possible, particularly with when at least approximate knowledge of the signal characteristic exists, e.g., through knowledge of the transmitted signal characteristic, to approximately determine the phase relationship of the received signal from the temporal position of the received signal, and vice versa. In general, the method can be used to determine the temporal position of the analog signal or the phase relationship of the analog signal, or both, particularly relative to a reference time, of a timer, for example, for example in the second object.

The temporal position and/or phase relationship are measured in particular against a reference time and/or a reference clock pulse, particularly at the second object. According to the invention, at least one first, particularly digital, piece of information is transmitted in encoded form by means of the transmission system in at least one first analog signal from a first object to a second object and/or between two objects, particularly by means of at least one first electrical, magnetic, or electromagnetic signal, particularly wave. Advantageously, the at least one first piece of information contains a plurality of bits, symbols, and/or chips and/or the at least one first piece of information is encoded in a plurality of bits, symbols, and/or chips in the signal.

In particular, at least one first plurality of symbols and/or chips is transmitted in encoded form by means of the transmission system at a first symbol or chip rate in at least one first analog signal (NF) from a first object to a second object and/or in at least one second analog signal (HF) generated on the basis of the first analog signal from a first to a second object.

The at least one first piece of information, symbols, or chips are arbitrary. Pieces of information, symbols, or chips that are independent of this method and/or the analysis according to the invention can be transmitted, e.g., payload data and/or data for improving the method, e.g., information about the signal or its edges.

The method can thus be used in conventional transmission systems, and the data and signals that are transmitted in any event can be used to carry out the analysis. The transmission of data specifically for the analysis is not absolutely necessary but can be advantageous. For instance, information about the emitted signal can be included. Advantageously, particularly at and/or in a first of the two objects for transmitting the at least one first analog signal, the at least one first piece of information is converted into the at least one first analog signal having a first frequency bandwidth, particularly by means of a modulation and/or encoding method such as QAM, FSK, or particularly GFSK, and particularly transmitted by means of the at least one first magnetic, electrical, or electromagnetic signal. The first analog signals can be further processed, particularly mixed, and/or filtered at a carrier frequency, prior to transmission. The at least one first analog signal can represent the at least one first magnetic, electrical, or electromagnetic signal. However, it is also conceivable, for example, for the at least one first magnetic, electrical, or electromagnetic signal to be generated by mixing the first analog signal at a carrier frequency.

The at least one first signal is emitted particularly by the first of the two objects.

The characteristic of the signal can usually be obtained through knowledge of the parameters and properties of the hardware of the transmitter or transmitter and receiver and knowledge of the transmitted information and/or measured and calculated on the basis measurements. Depending on the design of the system, the information of the signal characteristic and/or the information necessary for determining it can be transmitted via the same medium as the signal.

Thus, with knowledge of the transmission system, the characteristic of the edge and the occurrence of edges can already be determined at least approximately just from the information that is transmitted or detected or received. This approximate knowledge may suffice. However, it can be improved by further measures; for instance, values measured at the transmitter or generated and/or emitted there can be transmitted with the information and used to improve and/or gain knowledge of the at least approximate characteristic of the edge. Approximate knowledge of the characteristic of the signal at the receiver can thus also be obtained, for example, through knowledge of the signal characteristic at the transmitter, during emission, and/or at a stage preceding the emission, e.g., upstream from a mixer or upstream from an amplifier of the transmitter.

Knowledge of the transmission channel and multipath conditions in particular can also be used to improve and/or gain knowledge about the at least approximately characteristic of the edge. Precise knowledge is optimal. This is usually not available, however. In particular, the method according to the invention is not intended to reconstruct the signal characteristic, for example for user data extraction, or to measure the characteristic of the edge, but rather in particular to determine the temporal position of the signal and/or the phase relationship thereof as accurately as possible, particularly relative to a reference time, for example of a timer in the second object.

For example, the signal used can be that which is used for digital data transmission, or another signal that is used exclusively for this purpose, for example, and/or the repeated and/or continuous transmission of a predetermined and/or constant logic signal, for example—e.g., a 0 or a 1, and/or the repeated and/or continuous transmission of the pure carrier signal can be used, particularly for a time interval of between 0.1 and 100 ms, particularly for at least 2 ms and/or at most 50 ms, and/or 10 to 10000 repetitions.

This method can be used in numerous known transmission systems such as Bluetooth, Wifi, DECT, mobile communications (GSM, UMTS, LTE, 5G), Ethernet, and others. In many such systems, the currently installed hardware is already able to implement the invention. The system according to the invention is thus advantageously a Bluetooth, Wifi, DECT, mobile communications (GSM, UMTS, LTE, 5G), and/or Ethernet system. As a result, simple and inexpensive implementation is usually possible in existing systems, usually by updating the software and/or firmware.

In addition, if the signal characteristic or the characteristic of the edge is not known to a potential attacker, this can provide reliable protection against relay attacks, for example in access control systems such as in a car with a keyless remote.

Advantageously, and after receipt of the at least one first electrical, magnetic, or electromagnetic signal and/or first analog signal at and/or in a second of the two objects, the at least one first electrical, magnetic, or electromagnetic signal and/or first analog signal is converted into received first, particularly digital, information that particularly corresponds to the greatest possible extent to the first digital information, and/or the conversion is performed particularly such that the first information is obtained with the greatest possible probability, with high probability, and/or without interference. This is done particularly by means of at least one first analog-to-digital converter, particularly at and/or in the second object, with sampling, particularly of the at least one electrical, magnetic, or electromagnetic signal and/or first analog signal, being particularly carried out with the at least one first analog-to-digital converter at a first sampling rate, with the first sampling rate being at least twice as large and/or fast as the first frequency bandwidth, as the frequency bandwidth of the signal supplied to the analog-to-digital converter, and/or as the bandwidth that is required to transmit the at least one first piece of information in the time used for the transmission of the at least one first piece of information. Sampling may be preceded by signal processing, such as filtering or mixing.

Advantageously, the first frequency bandwidth, the frequency bandwidth of the signal supplied to the analog-to-digital converter, and/or the bandwidth necessary for transmitting the at least one first piece of information in the time that is necessary and/or used for the transmission of the at least one first piece of information is 50 MHz or less, particularly 16 MHz or less. The improvement in accuracy and security against relay attacks provided by the method according to the invention is especially pronounced at such bandwidths.

Advantageously, the resolution and/or bit depth, i.e., particularly the fineness of the digital conversion, of the first sample is greater than 1 bit, particularly greater than 6 bits, preferably greater than 12 bits. This increases the accuracy of the process. According to the invention, at least one first sample value of the at least one first analog signal is used to determine a temporal position and/or phase relationship, optionally after the signal has been further processed, particularly down-mixed and/or filtered, particularly by means of low-pass used, particularly by means of the at least one first analog-to-digital converter. The at least one first sample value lies in a rising or falling edge of the at least one first analog signal and/or of the at least one first received analog signal, which can be recognized, for example, from the sample value itself and/or the characteristic of adjacent sample values.

A "sample value" is to be understood as the value, for example the amplitude value, of a sample. The sampling takes place at a timepoint or (for the purpose of averaging, for example) over a time interval. The result of the sampling is as a sample value at a timepoint or time interval.

The term "edge" is to be understood particularly as any change in the analog signal, for example with respect to amplitude, frequency, phase, I and/or Q value, assuming at least ten intermediate values (which need not all be sampled), particularly continuously and/or or monotonically, from a first value at a first time to a second value at a second time, with the intermediate values being between the first and the second value and being captured between the first and the second time, and in particular with the intermediate values rising monotonically or falling monotonically over time between the first and the second time, particularly in strictly monotonic fashion, particularly so as to be equidistantly distributed in terms of value and/or time, particularly when the signal is viewed without multipath effects, interference, and/or superposition of the signal and/or of the signal during its emission.

According to the invention, together with knowledge of the characteristic of the edge in the at least one first analog signal, particularly at the transmitter and/or first object, the position, particularly the temporal position of the at least one first sample in the at least one first analog signal, particularly in and/or at second object, and hence the temporal position and/or phase relationship of the first analog signal at a first reference time, also called reference clock pulse, particularly at and/or in the first and/or second object, is determined and/or an action is carried out as a function of the temporal position of the signal, particularly in and/or at the second object, particularly in and/or at the second object, particularly the emission of a first response signal from the second object, particularly such that a particularly predetermined relationship exists between the temporal position and/or phase position of the first analog signal, particularly in and/or at the second object, and of the first response signal, particularly in and/or at the second object, particularly an edge of the first response signal and/or between the receipt and/or the sampling of the at least one first signal, particularly the edge of the at least one first analog signal, particularly in and/or at the second object, and the emission of the first response signal, particularly of an edge of the first response signal, and/or this relationship is transmitted to the first object and/or to an evaluation unit.

In particular, the first and the second object are spaced apart from one another and/or can be moved relative to one another. In particular, the first analog signal is transmitted by radio and/or cable from the first to the second object.

Advantageously, it is a bidirectional, particularly digital, data transmission system, it not being absolutely necessary for payload to be transmitted bidirectionally—e.g., transmission of payload in one direction and transmission of acknowledgment data to the other is sufficient.

In particular, at least one second, particularly digital, piece of information is transmitted in encoded form by means of the transmission system in at least one first analog signal from the second object to the first object, particularly by means of at least one second electrical, magnetic, or electromagnetic signal. Particularly at and/or in the second object for transmitting the at least one second electrical, magnetic, or electromagnetic signal, the second information is converted into the at least one first analog signal having a second frequency bandwidth, particularly by means of a modulation and/or encoding method such as QAM, FSK, or particularly GFSK, and particularly transmitted by means of the at least one second electromagnetic signal. The second analog signals can be further processed, particularly mixed, and/or filtered at a carrier frequency, prior to transmission. The at least one second analog signal can represent the at least one second magnetic, electrical, or electromagnetic signal. However, it is also conceivable, for example, for the at least one second magnetic, electrical, or electromagnetic signal to be generated by mixing the second analog signal at a carrier frequency.

In particular, after receipt of the at least one second electrical, magnetic, or electromagnetic signal and/or the second analog signal, particularly at and/or in the first object, the at least one second magnetic, electrical, or electromagnetic signal and/or the second analog signal is converted into received second digital information, particularly by means of at least one second analog-to-digital converter, particularly at and/or in the first object.

In particular, at least one first sampling, particularly of the second analog signal and/or of the at least one second magnetic, electrical, or electromagnetic signal is performed at a second sampling and/or sampling rate (also called an at least one second sampling), particularly with the at least one second analog-digital converter, particularly in and/or at the first object. In particular, the second sampling rate is at least twice as large and/or fast as the second frequency bandwidth, as the frequency bandwidth of the signal applied to the second analog-to-digital converter, and/or as the bandwidth that is required to transmit the at least one second piece of information in the time used for the transmission of the at least one second piece of information.

Advantageously, the second frequency bandwidth, the frequency bandwidth of the signal supplied to the second analog-to-digital converter, and/or the bandwidth that is required and/or used to transmit the at least one second piece of information in the time used for the transmission of the at least one second piece of information, and/or particularly 50 MHz or less, more particularly 16 MHz or less. The improvement in accuracy and security against relay attacks provided by the method according to the invention is especially pronounced at such bandwidths.

Advantageously, the resolution and/or bit depth, i.e., particularly the fineness of the digital conversion, of the second sample is greater than 1 bit, particularly greater than 6 bits, preferably greater than 12 bits. This increases the accuracy of the process. Advantageously, the at least one first sample value of the at least one second analog signal—which can also be referred to as at least one second sample value and particularly as a sample value of the second analog-to-digital converter—is used to determine a temporal position and/or phase relationship. In this case, the at least one second sample value can also be determined after the signal has been further processed, particularly down-mixed and/or filtered, particularly by means of low-pass.

The at least one second sample value lies in a rising or falling edge of the at least one second analog signal and/or second received analog signal, which can be recognized, for example, from the sample value itself and/or the characteristic of adjacent sample values.

Advantageously, together with knowledge of the characteristic of the edge in the at least one second analog signal, the position, particularly the temporal position and/or phase relationship of the second analog signal at a second reference time, also called second reference clock pulse, particularly at and/or in the first object, is determined and/or an action is carried out as a function of the temporal position of the signal, particularly in and/or at the first object, particularly in and/or at the first object, particularly the emission of a second response signal from the first object, particularly such that a particularly predetermined relationship exists between the temporal position and/or phase position of the second analog signal, particularly in and/or at the first object, and of the second response signal, particularly in and/or at the first object, and/or between the receipt and/or the sampling of the at least one second signal, particularly in and/or at the first object, and the emission of the second response signal, and/or this relationship is transmitted to the second object and/or to an evaluation unit.

It is with particular advantage that the first response signal represents at least one second analog signal and/or that the first response signal contains at least one second analog signal. It is with particular advantage that the second response signal represents at least one first analog signal and/or that the second response signal contains at least one first analog signal.

Advantageously, the method is repeated multiple times and, in particular, an averaging of the temporal positions, transit times, and/or phase shifts of the individual repetitions is performed. In particular, each edge of an analog signal can be used to carry out the method; such edges are numerous in the case of analog signals in which information, particularly digital information, is encoded. Advantageously, the method is carried out repeatedly using different antennas at the first and/or second object and/or carried out simultaneously multiple times using a plurality of particularly different antennas at the first and/or second object and/or a plurality of particularly different antennas are used to transmit and/or receive the at least one first and/or at least one second analog signal and/or the at least one first and/or at least one second magnetic, electrical, or electromagnetic signal at the first and/or second object. When using multiple antennas, these are preferably used such that their directions of polarization are different, particularly perpendicular to one another.

It is especially advantageous if the method is carried out during a transmission by means of I&Q method and/or QAM at least twice, particularly in parallel using at least one edge of the I signal or signal component as the first and/or second analog signal and using at least one edge of the Q signal or signal component as the first and/or second analog signal.

Advantageously, a first signal transit time and/or first phase shift of the at least one first analog signal from the first to the second object and/or a second signal transit time and/or second phase shift of the at least one second analog signal from the second to the first object and/or a round-trip signal transit time and/or round-trip phase shift of the at least one first analog signal and of the at least one second analog signal from the first object via the second object to the first object is determined.

This can be achieved, for example, in that the first analog signal having an edge beginning at a first time, is transmitted at the first object, and the second object determines the time of receipt of at least one first sample value in the edge of the received first analog signal relative to a reference clock pulse and emits a first response signal that contains or represents a second analog signal having an edge beginning at a second time, and the second object transmits the at least one time interval that elapses between receipt of the at least one first sample value and emission of the beginning of the edge of the second analog signal to the first object and/or an evaluation unit. In addition, the first and/or second object and/or the evaluation unit determines the at least one second time interval that elapses between emission of the value of the edge of the first analog signal corresponding to the at least one first sample value and reception of at least one second sample value in the edge of the second analog signal. Moreover, the first and/or second object and/or the evaluation unit determines the at least one third time interval that elapses between emission of the beginning of the edge of the second analog signal and emission of at least one value in the edge of the second analog signal corresponding to the at least one second sample value. The round-trip transit time and thus the distance can be determined from the time intervals by assuming the round-trip transit time to be second time interval minus first time interval and minus third time interval. In this regard, a first, a second, and a third time interval is associated with each pair of the first sample value of the first signal and the first sample value of the second signal. The round-trip transit times resulting from different first, second, and third time intervals can be averaged.

Advantageously, a distance between the first and second object is determined from the first and/or second signal transit time and/or first and/or second phase shift and/or round-trip signal transit time and/or round-trip phase shift.

Advantageously, the signal characteristic, particularly the arrangement and/or the configuration and/or the profile of the edges of the at least one first and/or second analog signal is communicated from the first to the second object and/or vice versa and/or to an evaluation unit, particularly in encrypted form. Advantageously, the particularly temporal position and/or phase relationship of the second analog signal and/or of at least one second sample value and particularly of the at least one second sample value in an edge of the second signal at the first object is communicated from the first and to the second object and/or to the evaluation unit.

Advantageously, the particularly temporal position and/or phase relationship of the first analog signal and/or the edge thereof at the second object and/or of at least one first sample value and particularly of the at least one first sample value in an edge of the first signal is communicated from the second and to the first object and/or to the evaluation unit.

Advantageously, the timepoint of the emission of the first and/or second signal and/or of at least one edge of the first and/or second signal is communicated to the first or second object and/or to the evaluation unit.

In multipath environments, edges of a first or second signal are during the transmission and/or they are altered, e.g., worn, upon receipt at the receiver through superpositions of different transmission paths.

In such cases, it is sometimes no longer possible to associate a single sample value of the received signal to a point in the emitted signal. It is usually possible to establish an association and/or to determine the edge of the signal component of one or fewer propagation paths only by taking numerous measurements and processing them. Also, it is usually not possible, or only with unreasonable effort, to calculate the shape of the edge at the receiver from the emitted signal. Particularly in such cases, the method includes, in particular, the transmission of a first test signal having at least one test edge from the first to the second object and/or the transmission of a second test signal having at least one test edge from the second to the first object and measuring at least a portion of the test edge of the first signal at the second object and/or of the second test signal at the first object, and—particularly multiple—implementation of the method with a first and/or second signal, the test edge being similar or identical to the edge in the first and/or second signal, with the first and/or second signal being particularly similar or identical to the test signal.

It is with particular advantage that a plurality of second receiving devices for receiving the at least one first analog signal are provided in such a manner as to be stationarily and securely connected to the second object but spaced apart therefrom, particularly by at least 10 cm, and/or at least one temporal position and/or phase relationship is determined in relation to each of the plurality of second receiving devices. In particular, the second object and the plurality of second receiving devices are part of a motor vehicle and/or the first object is an access means, in particular a wireless key. In particular, the second object and the plurality of second receiving devices are part of an access means, particularly of a wireless key, and/or the first object is a motor vehicle. In particular, on the basis of the first signal that is received at the second object and/or at the plurality of second receiving devices, particularly of the first sample value of the at least one first signal, a direction and/or a distance is determined in which the first object lies, particularly by triangulation, particularly by means of an evaluation unit. In particular, on the basis of the at least one first signal that is received at the second object and/or at the plurality of second receiving devices, an angle and/or angle difference between the first and second objects and/or one of the plurality of second receiving devices and/or between the second object and one of the plurality of second receiving devices, particularly through phase comparison of the at least one first signal, particularly of the first sample value of the at least one first signal, at the second object and/or the plurality of second receiving devices, particularly by an evaluation unit. In particular, a relative orientation, an angle, a change in the relative orientation and/or in the angle, a distance, and/or change in the distance between at least one first and one second object and/or a second receiving device is thus determined, particularly by an evaluation unit.

It is with particular advantage that a plurality of first objects are provided in such a manner as to be stationarily and securely connected to the first object but spaced apart therefrom, particularly by at least 10 cm, and/or the method is carried out in relation to each of the plurality of first objects and, in particular, at least one temporal position and/or phase relationship is determined in relation to each first object from the at least one signal that is received at the second object.

It is with particular advantage that a change in distance between the first and second object is determined on the basis of the phase change between the at least one first received signal and at least one additional first signal, and/or it is determined from this by what length at least two signal paths of the first and the first additional signal differ, particularly under the assumption of a static arrangement and environment of the first and second object during the transmission of the first and the first additional signals, particularly by an evaluation unit. In particular, the shortest signal path and/or the signal component that was received over the shortest signal path is determined, particularly by an evaluation unit.

It is with particular advantage that, on the basis of the phase change between the received first signal and the at least one first additional signal, an angle of incidence and/or a change therein between the first and second object is determined and/or it is determined by what irradiation and/or emission angle at least two signal paths of the first and of the first additional signal differ, particular under the assumption of a static arrangement and environment of the first and second objects and/or of the receiving devices and of the second object during the transmission of the first and of the first additional signals, particularly by an evaluation unit.

The object is also achieved by a method for securing an access system having a first object, particularly authorization means, and a second object, particularly access control means, wherein at least one first analog signal is transmitted in encoded form from the first object to the second object by means of a transmission system, wherein a temporal position and/or phase relationship is determined by means of a method or system according to the invention and, in the event of an overshoot of a predetermined deviation of the determined temporal position and/or phase relationship from the first reference time and/or in the event of a deviation of the determined temporal position and/or phase relationship from a temporal position and/or phase relationship that was predetermined or calculated by other methods, access, egress, activation, deactivation, and/or opening is denied by the second object, particularly access control means, and/or a signal transit time and/or round-trip signal transit time and/or a distance is determined on the basis of the determined temporal position and/or phase relationship and, if the determined signal transit time and/or round-trip signal transit time and/or distance exceeds a predetermined distance and/or a predetermined deviation from a signal transit time and/or round-trip signal transit time determined in another manner or by means of another method, access, egress, activation, deactivation, and/or opening, particularly by the second object, particularly access control means, is denied.

The object is also achieved by an access control system comprising a first object, particularly an authorization means, and a second object, particularly an access control means, the access control system comprising a transmission system, particularly a first and second antenna, set up between the first object and the second object to transmit at least one first analog signal in encoded form from the first object to the second object, wherein the access control system is configured so as to determine a temporal position and/or phase relationship by means of one of the above methods and, if a predetermined deviation of the temporal position and/or phase relationship of the first reference time and/or in the event of deviation of the temporal position and/or phase relationship from a predetermined temporal position and/or phase relationship that was calculated using other methods, to deny access, egress, activation, deactivation, and/or opening, particularly by the second object, particularly access control means and/or to determine a signal transit time and/or signal round-trip transit time and/or a distance on the basis of the determined temporal position and/or phase relationship and, if the determined signal transit time and/or signal round-trip transit time and/or distance exceeds a predetermined distance and/or if a predetermined deviation from a signal transit time and/or signal round-trip transit time determined in another manner or by means of another method is exceeded, to deny access, egress, activation, deactivation, and/or opening, particularly by the second object, particularly access control means.

The object is also achieved through the use of a temporal position and/or phase relationship for access control, authentication, distance measurement, synchronization, and/or detection and/or defense against relay attacks, with at least one first analog signal is transmitted in encoded form from a first to a second object by means of a transmission system, particularly having a first and second antenna, and used to detect the temporal position and/or phase relationship, the temporal position and/or phase relationship being determined by means of one of the aforementioned methods and/or systems.

In particular, with regard to the methods, the use, and/or the system, access, egress, activation, deactivation, and/or opening, particularly by the access control means and/or of the access control means, is granted if there is no deviation and/or overshoot or if there is no deviation and/or overshoot. In particular, the access, egress, activation, deactivation, and/or opening is granted only if there are no or only a predetermined number of deviation and/or overshoots in a multitude of repetitions, or if no or no more than a predetermined number of deviations and/or overshoot(s) are/were present.

In particular, the access, egress, activation, deactivation, and/or opening is granted only if at least one further authentication requirement is met—e.g., a correct password is entered or the certificate is valid and/or designated as permissible in the access system. It is especially advantageous if the at least one authentication requirement includes a plurality of authentication requirements that are dependent on the time of reception, particularly according to this application, and/or at least one authentication requirement that is independent of the reception time. The temporal validity of a certificate—which, although it may be dependent on time, it is not directly dependent on the time of reception itself—is also independent of the time of reception.

In particular, access is understood not only as access to an area in the sense of the possible movement of an object and/or a person into this area, e.g., the interior of a room or of a vehicle, but also, in particular, access to a function, particularly including in the sense of the activation of a function, such as access to the function of cranking or starting a vehicle or access to the "coffee" function of a coffee machine. Accordingly, access control systems are particularly not only those which control, restrict, and/or protect only access to an area in the sense of the possible movement of an object and/or a person into this area, but particularly also those which control, restrict, and/or protect access to a function, particularly including in the sense of the activation of a function.

Authorization systems, e.g., for registration in a computer system, for example by means of a password and/or certificate, or also classic access control systems such as locks, barriers, doors, and/or gates, and/or for the activation of functions, for example a service station such as a coffee machine, can also be employed particularly as an access control system. In particular, these can be doors and/or ignition locks and/or starters of a vehicle (e.g., motor vehicle, aircraft, ship, or autonomous taxi—as well as any and all other conceivable vehicles). They can also involve access to and/or activation of any service station (ATM, telephone, coffee machine—the list is never-ending). Mobile telephone, keys, certificates, and/or input systems for entering passwords can also be used as authorization means.

In particular, the transmission system of the method, of the use, and/or of the system is a wireless system, for example one that is used for communication with keyless remotes or near-field keys, particularly for motor vehicles, and/or between such and a motor vehicle, or two Bluetooth modules. In particular, the method includes the multiple transmission of a first test signal having at least one test edge from the first to the second object and/or the multiple transmission of a second test signal having at least one test edge from the second to the first object and the measurement of at least a portion of the test edge of the first test signal at the second object and/or of the second test signal at the first object by means of time-staggered sampling of the received test signal between the repetitions and reconstruction of the received test edge from the time-staggered samples of the test edges of the multiple transmission or reception thereof, under the assumption that the change in environmental influences is negligible over the duration of the repetitions and, in particular, the test edges of the multiple transmission are received identically. In particular, the multiple transmission is at least 5-fold, particularly at least 10-fold transmission. In particular, the multiple transmission takes place in a time span of less than 10 s, particularly less than 1 s, more particularly less than 500 ms.

It can also usually be assumed that the influence of the environment is independent of the direction of transmission between the first and second object, so the measurement of and/or the knowledge of the change in the transmission in one direction and/or the measurement of and/or the knowledge of the edge and/or test edge received at the first or second object is sufficient.

Thus, a repetition of the emission can occur at a repetition frequency FW and the sampling can occur at a frequency FS, the sampling of the received signal being temporally changed between the individual repetitions of the transmission or the reception of the repetitions of the transmission such that the temporal position the samples is shifted relative to the emitted signal by a time amount smaller than the time between two samples and particularly at least five, particularly at least 10, samples are taken at different temporal positions in the repetitions of the test edge and/or of the signal or chip period.

In particular, the test signal represents or contains a first or second signal, particularly of a preceding or subsequent implementation of the method and/or a preceding or subsequent first or second signal of the execution of the method. The test signal can also represent or contain the first signal or the second signal of the execution of the method in which the knowledge of the edge obtained from the test signal is used.

In particular, the method is carried out such that it is assumed that the change in the transmission of the first or second test signal is identical or approximately identical to the change in the transmission of the additional first or second test signals and/or the change in the transmission of the second signal from the second to the first object, particularly if the edge in the first signal is identical and/or approximately identical to that in the second signal and/or it is assumed that the change in the transmission of a first signal of a first execution of the steps from the first to the first second object is identical or approximately identical to the change in the transmission of a second first signal from the second to the first object, particularly if the edge in the first signal is identical and/or approximately identical to that in the second signal.

Preference is given to first and second objects and/or to the use of first and second objects that are embodied such that they emit and/or receive and/or sample a first and/or second signal identically. In particular, they have identically constructed transmitting and/or receiving units and/or identically constructed sampling means, identically constructed analog-to-digital converters, identically constructed digital-to-analog converters, identical antennas, identical antenna arrangements, and/or identically constructed oscillators.

In particular, by measuring the change or receipt of the edge or test edge a single time, particularly by reconstructing the test edge from the measurement of several repetitions of the transmission and/or reception of the test edge, and multiple use of the knowledge, the method can thus be carried out in a very efficient and quick manner. As a result, it can also be sufficient to provide the means for measurement and/or reconstruction only at the first or second object; this is particularly advantageous if one of the objects is a portable device, such as a key or mobile telephone, or the method is to be carried out with numerous first or numerous second objects. The staggered sampling of repeated test signals makes it possible to carry out the method reliably even in more complex environments using simple and inexpensive hardware.

In particular, only fewer than 10 samples per edge are taken per first and/or second signal, provided that it is not a test signal. In particular, only five or fewer samples are taken per edge per first or second signal. In particular, the sample values of at least 5 repetitions of the emission of the test edge are combined and/or used together, particularly to reconstruct the test edge.

Advantageously, the time interval between, firstly, the reception and/or sampling of the at least one first signal at the second object and/or of the at least one first sample in an edge of the first signal at the second object and, secondly, the emission of the response signal, which particularly represents a second signal, or of an edge in the second signal, is communicated to the first object and/or the evaluation unit and/or this time interval is known to the first object and/or to the evaluation unit, particularly because it is always selected identically.

It is particularly advantageous if the first and/or second sampling rate is at least 1.8 times, particularly at least two times, more particularly at least 3.8 times the symbol rate of the first and/or second analog signal, the first and/or second frequency bandwidth, of the frequency bandwidth of the first or second signal that is supplied to the analog-to-digital converter, and/or the bandwidth that is necessary for transmitting the at least one first and/or second piece of information in the time used for the transmission of the at least one first and second information and/or the chip rate of the first and/or second analog signal.

Advantageously, a plurality of first samples are taken of the first and/or second analog signal and used, and/or the characteristic of the edge of the first and/or second analog signal, resolution, and/or bit depth of the first sample of the first and/or second analog signal is selected such that, over the course of the edge of the first and/or second analog signal, at least two, particularly at least three sampling operations are performed that particularly have different sample values.

To special advantage, the method is repeated at least n times using at least n different combinations of first objects and second objects, with a uniform and/or dedicated object being involved in all combinations at each of the n combinations as a first or second object and the other being selected from first and second object of the combination from a set of n objects such that each of the n objects represents a first or second object in at least one of the at least n repetitions of the method and/or n combinations. Thus, apart from a maximum of one of the n objects, the method is carried out at least once using each of the n objects as the first or second object. Also, apart from a maximum of one of the n objects, the method is carried out at least once using each of the n objects as the second object. In particular, the uniform and/or dedicated object is a portable and/or mobile object and/or a mobile telephone and/or a, particularly radio-based, authentication means such as a digital and/or wireless key.

To special advantage, the method is repeated at least n times using at least n different combinations of first objects and second objects, the first and second objects of the combinations being formed from a set of n objects such that each of the n objects, apart from at most one of the n objects, represents a first object in at least one of the at least n repetitions and a second object in at least one other of the at least n repetitions. Thus, apart from a maximum of one of the n objects, the method is carried out at least once using each of the n objects as the first object. Also, apart from a maximum of one of the n objects, the method is carried out at least once using each of the n objects as the second object. The commutation and/or variation of a combination is considered, in particular, to be identical to the combination. The combinations are particularly combinations without repetition.

In both advantageous embodiments described above, the determined temporal positions of the respective first analog signal, particularly at a reference time, and/or information derived therefrom, particularly distances and/or positions of and/or between the objects, n objects, and/or a selection of n objects in and/or at a common location, particularly at one of the objects, particularly at the uniform and/or dedicated object, are particularly provided at the respective second object of all repetitions at a common location and, in particular, processed. The provision can be achieved by means of a transmission, for example. By virtue of the centralized provisions, the relative distances can be determined in a centralized manner. In particular, each time a first signal is transmitted by one of the n objects that is used as the first object, the signal is received from at least one other, particularly from all other of the n objects not involved in the combination, and the method is carried out for each of the received objects, particularly for each of the objects not used for the emission of the first signal, as the second object together with the first object used for the emission. This makes it possible to determine n-1 temporal positions per first signal.

In particular, each time a second signal is transmitted by one of the n objects that is used as the second object, the signal is received from at least one other, particularly from all other of the n objects not involved in the combination, and the method is carried out for each of the received objects, particularly for each of the objects not used for the emission of the second signal, as the first object together with the second object used for the emission.

The n objects are particularly positioned in a stationary manner. In particular, their position is known to the second object and/or, in particular, their position at the common location is known.

In particular, n is at least equal to two, particularly greater than three.

It is with particular advantage that, in all of the at least n repetitions of the method, the method according to the invention is additionally carried out between the respective first object (from the n objects) of the respective repetition and a second object that is uniform and/or dedicated in all of the at least n repetitions and is particularly not part of the n objects.

In particular, the determined temporal positions of the first analog signal are made available at a reference time in and/or at the second object, which is uniform and/or dedicated for all repetitions, at the one common location and, in particular, processed, and/or the one common location is the second object, which is uniform and/or dedicated for all repetitions.

It is with particular advantage that, in all of the at least n repetitions of the method, a first and/or second signal that is uniform and/or dedicated for all of the at least n repetitions is received, i.e., "overheard," that is particularly not part of the n objects. In particular, this uniform object takes at least one first sample of each first and/or second signal of the at least n repetitions of the method in a rising or falling edge of the first and/or second analog signal. In particular, together with knowledge of the characteristic of the edge in the first and/or second analog signal, the temporal position of the at least one first sample value in a first and/or second analog signal is determined and hence in particular the temporal position of the first and/or second analog signal at a reference time in and/or at the uniform and/or dedicated object.

The second object, which is uniform for all repetitions, is not stationary, however; in particular, its position is not known before the method is carried out. In particular, the method determines its position and/or orientation, at least relative to the n objects: In particular, the second object, which is uniform for all repetitions, is a portable object, particularly a mobile telephone.

The object is also achieved by a method for securing an access system, particularly for a motor vehicle, comprising an authorization means, particularly a keyless remote and/or mobile telephone, and an access control means, particularly in the motor vehicle, wherein the access control means particularly controls a lock, a barrier, and/or a securing means, wherein electrical, magnetic, or electromagnetic signals, particularly waves, are transmitted between the authorization means and the access control means, wherein the signal transit time and/or round-trip signal transit time between authorization means and access control means is determined by the above method, particularly with one or more of the embodiments that are described as being advantageous, and, in the event of an overshoot of a predetermined signal transit time and/or round-trip signal transit time or of a predetermined distance between authorization means and access control means, and/or in the event of an overshoot of a predetermined deviation from a signal transit time and/or round-trip signal transit time determined in another manner and/or by means of another method, particularly between authorization means and access control means, access, egress, activation, deactivation, and/or opening, particularly by the access control means, is denied, with the authorization means representing a first of the two objects first and second object and the access control means representing the second of the two objects first and second object. In particular, the access system is configured such that the authorization means, particularly by means of the electrical, magnetic, or electromagnetic signals, can cause the access control means to grant access and/or egress, perform an opening, and/or a to open lock, a barrier, and/or a securing means.

The access control means and/or securing means can also be instantiated by software and/or by a software and hardware unit.

The object is also achieved by a, particularly digital, transmission system, with means for analyzing the temporal position and/or phase relationship, particularly for transit time measurement, phase measurement, or synchronization, wherein the transmission system has at least two objects and is configured to transmit at least one first, particularly digital, piece of information in at least one first analog signal in encoded form between the two objects, particularly by means of at least one first electrical, magnetic, or electromagnetic signal.

The object is also achieved by a first object that is configured to carry out the method in cooperation with a second object and/or to form a transmission system, and/or by a second object that is configured to carry out the method in cooperation with first second object and/or to form a transmission system.

The first object and/or the first object of the two objects of the transmission system is particularly configured to transmit the at least one first magnetic, electrical, or electromagnetic signal and to convert the at least one first piece of information into the at least one first analog signal having a first frequency bandwidth and to transmit same by means of the at least one first electrical, magnetic or electromagnetic signal.

The second object and/or the second object of the two objects of the transmission system particularly has at least one first analog-to-digital converter and/or is particularly configured to receive the at least one first electrical, magnetic, or electromagnetic signal and, in particular, to perform a conversion of at least one first magnetic, electrical, or electromagnetic signal into received first, particularly digital, information, particularly by means of the at least one first analog-to-digital converter, the at least one first analog-to-digital converter being configured to perform sampling at a first sampling rate, the first sampling rate being at least twice as large and/or fast as the first frequency bandwidth, as the frequency bandwidth of the signal supplied to the analog-to-digital converter, and/or as the bandwidth that is required to transmit the at least one first piece of information in the time used for the transmission of the at least one first piece of information.

In particular, the system, the evaluation unit, and/or the objects each represent hardware and software systems; in particular, they have a CPU and a memory, with a program being stored in particular in the memory in order to carry out and/or control the described steps, particularly a method according to the invention, particularly in which the program is executed by the CPU.

Advantageously, the resolution and/or bit depth, i.e., particularly the fineness of the digital conversion, of the first and/or second signal and/or of the analog-to-digital converter is greater than 1 bit, particularly greater than 6 bits, preferably greater than 12 bits. This increases the accuracy of the system.

The system is configured to take at least one first sample value of the at least one first analog signal of the at least one first analog-to-digital converter in a rising or falling edge of the at least one first analog signal and to use this to determine a temporal position and/or phase relationship by determining, from the at least one first sample value together with knowledge of the characteristic of the edge in the at least one first analog signal and/or phase relationship of the at least one analog signal at a reference time, also called reference clock pulse, particularly at and/or in the first and/or second object, and/or to carry out an action as a function of the temporal position of the signal, particularly in and/or at the second object, particularly in and/or at the second object, particularly the emission of a first response signal from the second object, particularly such that a particularly predetermined relationship exists between the temporal position and/or phase position of the first analog signal, particularly in and/or at the second object, and of the first response signal, particularly in and/or at the second object and/or between the receipt and/or the sampling of the at least one first signal, particularly in and/or at the second object, and the emission of the first response signal, and/or this relationship is transmitted to the first object and/or to an evaluation unit.

In particular, the system is configured to carry out a method according to the invention. In particular, it has an evaluation unit. In particular, the first and the second object each have at least one antenna, at least one oscillator and/or frequency synthesizer, and at least one analog-to-digital converter. Advantageously, they also each have a mixer, with several antennas, in particular a switch or switch for switching between the antennas, a controller for operations including timer, a digital-to-analog converter, an input amplifier, an output amplifier, and/or a CPU.

The object is also achieved by an access system, particularly for a motor vehicle, comprising an authorization means, particularly a keyless remote and/or mobile telephone, and an access control means, particularly in the motor vehicle, wherein the access control means is particularly configured to control a lock, a barrier, and/or a securing means, wherein electrical, magnetic, or electromagnetic signals, particularly waves, are transmitted between the authorization means and the access control means, wherein the access system is particularly a system according to the invention as described above and configured to determine the signal transit time and/or signal round-trip signal transit time between authorization means and access control means by means of the above method, particularly with one or more of the embodiments that are described as being advantageous, and, in the event of an overshoot of a predetermined signal transit time and/or round-trip signal transit time or of a predetermined distance between authorization means and access control means, and/or in the event of an overshoot of a predetermined deviation from a signal transit time and/or round-trip signal transit time determined in another manner and/or by means of another method, is configured to deny access, egress, activation, deactivation, and/or opening, with the authorization means representing a first of the two objects first and second object and the access control means representing the second of the two objects first and second object. In particular, the access system is configured such that the authorization means, particularly by means of the electrical, magnetic, or electromagnetic signals, can cause the access control means to grant access and/or egress, perform an opening, and/or a to open lock, a barrier, and/or a securing means.

The object is also achieved through the use of at least one first sample value of at least one first analog signal, particularly of at least one first analog-digital converter, for the time-resolved detection of the position and/or phase relationship of the first analog signal, particularly of an edge of the first analog signal, determined at a first reference time, also called reference clock pulse, particularly at and/or in the second object, and/or to carry out an action as a function of the temporal position of the signal, particularly in and/or at the second object, particularly in and/or at the second object, particularly the emission of a first response signal from the second object, particularly such that a particularly predetermined relationship exists between the temporal position and/or phase relationship of the first analog signal, particularly in and/or at the second object, and the first response signal, particularly an edge of the first response signal, particularly in and/or on the second object, and/or between the reception and/or the sampling of the at least one first analog signal, particularly in and/or on the second object, and the emission of the first response signal, and/or this relationship is transmitted to the first object and/or to an evaluation unit, and/or for the time-resolved detection of the position of the at least one first analog signal and/or of an edge of the first analog signal relative to a second reference time.

Advantageously, the use also includes the use of at least one first sample value of at least one second analog signal, also referred to as at least one second sample value, particularly at least one first analog-to-digital converter for the time-resolved detection of the position and/or phase relationship of the second analog signal, particularly of an edge of the second analog signal, at a second reference time, also called reference clock pulse, particularly at and/or in the first object, and/or as a function of the temporal position of the signal, particularly for performing an action, particularly in and/or at the first object, particularly the emission of a second response signal from the first object, particularly such that a predetermined relationship exists between the temporal position and/or phase position of the second analog signal, particularly in and/or at the first object, and the second response signal, particularly in and/or at the first object, and/or between the reception and/or the sampling of the at least one second analog signal, particularly in and/or on the first object, and the emitting of the second response signal, and/or this relationship is transmitted to the second object and/or to the evaluation unit, and/or for the time-resolved detection of the position of the at least one second analog signal and/or of an edge of the second analog signal relative to a second reference time.

It is with particular advantage that the first response signal represents at least one second analog signal and/or that the first response signal contains at least one second analog signal. It is with particular advantage that the second response signal represents at least one first analog signal and/or that the second response signal contains at least one first analog signal. All of the advantageous embodiments of the method can also be applied to the use. In particular, the use can utilize a system according to the invention. The method can be carried out particularly using a system according to the invention.

Advantageously, the method and/or the use includes the determination of the distance between the first and second object from the first and/or second signal transit time and/or first and/or second phase shift and/or round-trip signal transit time and/or round-trip phase shift.

Advantageously, the use includes the determination of a first signal transit time and/or first phase shift of the at least one first analog signal from the first to the second object and/or a second signal transit time and/or second phase shift of the at least one second analog signal from the second to the first object and/or a round-trip signal transit time and/or round-trip phase shift of the at least one first analog signal and of the at least one second analog signal from the first object via the second object to the first object.

Advantageously, the first analog signal is generated at the first object and transmitted therefrom by means of electromagnetic, electrical, or magnetic signals to a second object and/or the sample value is determined at the second object and, in particular, the first reference time is a time at the second object and/or the second reference time is a time at the first object and/or the action is initiated and/or carried out at the second object and/or the first response signal is emitted from the second object and/or the temporal relationship between the temporal position of the first analog signal at the second object and the first response signal at the second object is particularly given.

BRIEF DESCRIPTION OF THE SEVERAL VIEWS OF THE DRAWINGS

Further advantageous embodiments and advantages will be explained purely by way of example and not by way of limitation with reference to the schematic drawing that follows. In the drawing.

DETAILED DESCRIPTION

Figure 1:
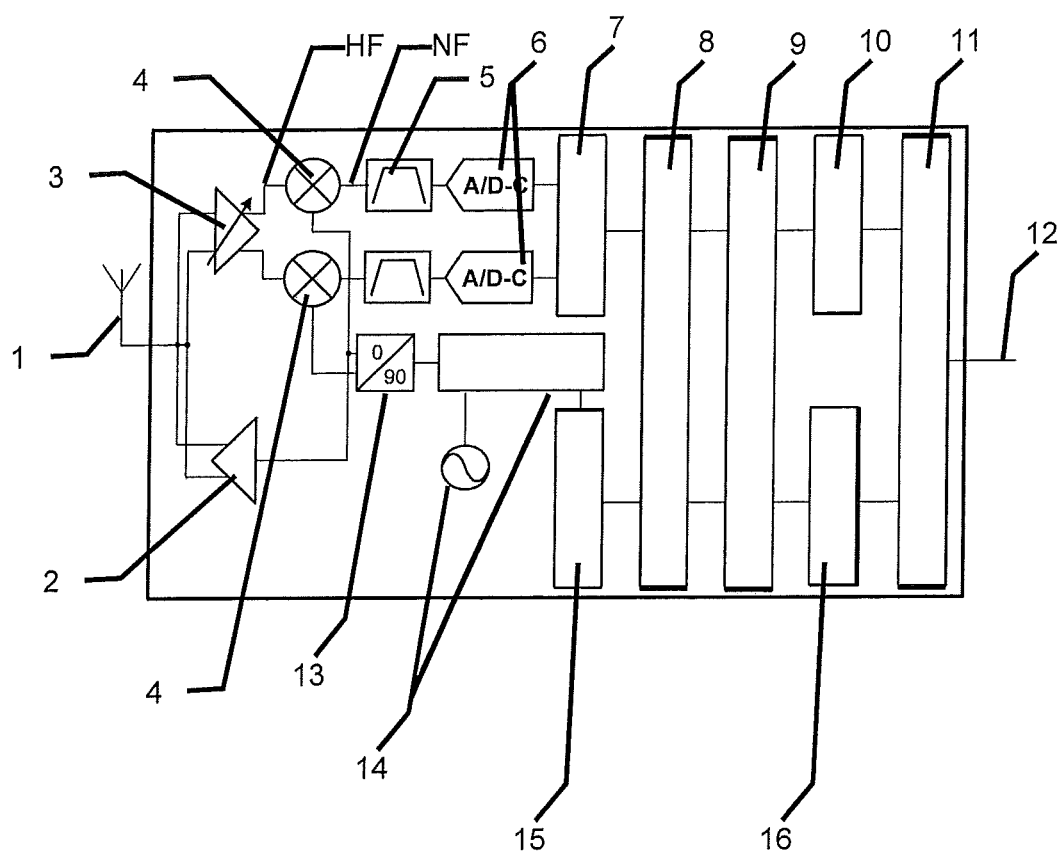
FIG. 1 shows a schematic representation of a transmitter and receiver module from the prior art.

FIG. 1 shows a schematic design of a transmitter and receiver module from the prior art. Such a module is embodied by the CC25 chip CC25 from Texas Instruments, for example. Such a transmitter and receiver module is suitable for transmitting data by means of an I&Q method, for example using the Bluetooth standard.

An antenna 1 is shown which is externally connected to the chip. The signals HF received by the antenna are conducted through the input amplifier 3 and then split into two signals. These are fed to two mixers 4 and then respectively conducted as low-frequency signals NF via a band-pass filter 5 to a respective analog-to-digital converter 6. In addition, one of the mixers 4 is supplied with a signal generated in the frequency synthesizer 14, while the other mixer 4 is supplied with the signal of the frequency synthesizer 14 only after passage through a phase shifter 13. The low-frequency I and Q signals NF can thus be obtained from the mixers 4. After the analog-to-digital converter 6, the I and Q signals are then fed in digital form to the demodulator 7 and then transferred via an error correction and decoding unit 8 to a packet handler 9 and the input memory 10. From there they travel to an interface driver 11 through which the data is then made available via the input 12, for example, for further processing by means of a CPU.

Data to be transmitted can be transferred via the input 12 to the interface driver 11 and are then written to an output memory 16 and transferred via the packet handler 9 to the error correction and encoding unit 8. Subsequently, the low-frequency signals NF generated in this way are transferred by means of a modulator 15 and the frequency synthesizer 14 as high-frequency signals HF to the transmission amplifier 2 and the antenna 1.

If such a module is to be used for a method, use, or system according to the invention, in addition to the reception data usually provided via the input 12, additional sampling values or sample values of the analog-to-digital converters 6 would also need to be picked up which, while they are usually collected in the analog-to-digital converter 6 and used only in the immediately following stages and not forwarded or reused—e.g., not from the chip used—are conducted out here via the input 12, for example.

It is true that the sample values could also be made available via the input 12 in principle, which could be possible by changing the firmware. But other data inputs and/or outputs are conceivable. As a matter of principle, however, the included hardware together with a CPU and appropriate software, particularly in a memory, are sufficient to implement the method according to the invention or to form an object of a system according to the invention.

Figure 2:
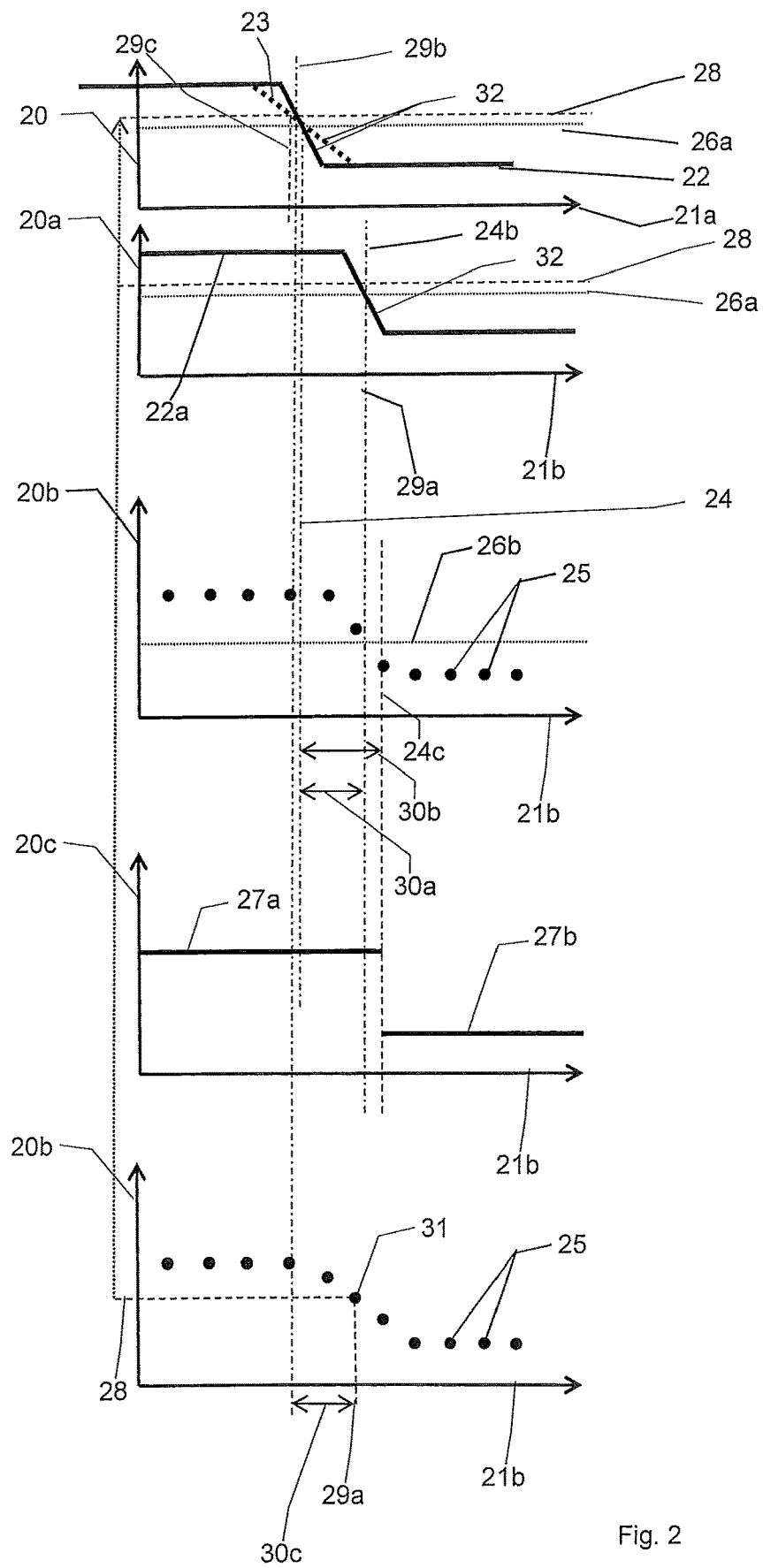
FIG. 2 shows an illustration of the method.

FIG. 2 shows a schematic illustration of the method according to the invention. Several coordinate systems are shown one above the other, each of which represents show a time axis on the horizontal axis and the characteristic of a signal on the vertical axis. The individual time axes 21a, 21b shown one above the other are arranged synchronously in time.

The uppermost coordinate system with the time axis 21a shows an analog signal 22 at a first object that is transmitting this signal. The vertical axis 20 shows the amplitude of the signal 22. The signal 22 initially runs constant at a first value, until it then drops off linearly in order to then continue constantly at a lower, second value. The mean amplitude of the signal is also shown as a dotted line, not as the mean 26a of the signal but as the mean between the first and second values. A vertical line 24, which represents the timepoint of the mean amplitude at the transmitter, is shown to start from the interface of the signal 22 and the mean amplitude 26a.

In the coordinate system beneath this—the second coordinate system of FIG. 2—the signal characteristic 22a at the receiver is shown in a coordinate system with time axis 21b and amplitude axis 20a. The signal characteristic 22a is one that is produced without further interference and distortion at the receiver.

It can be seen that the signal 22a at the receiver is shifted to the right by the signal transit time 30a, time interval between line 29b and 29a. The mean amplitude of the signal 26a is also shown, as in the first figure. A vertical line 24b, which represents the timepoint of the mean amplitude at the receiver, is shown to start from the interface of the signal 22a and the mean amplitude 26a.

The coordinate system beneath that, in the third coordinate system, shows—as circles—samples having sample values that represent amplitude values, with each of the samples taking place at a timepoint/during a time interval (extension of the circles along the time axis). The samples are those of an analog-to-digital converter and those of the signal 22a. These are shown in a coordinate system with time axis at the receiver 21b and sample value at the receiver 20b.

The decision threshold 26b of the receiver is also shown. In the case of a sample value above this decision threshold 26b, a logical "one" is assumed; if a sample value falls below this decision threshold, a logical "zero" is assumed. The decision threshold at the value of the mean amplitude is shown here. But it can also be at a different value.

In the coordinate system below that, in the fourth coordinate system of FIG. 2, the digital signal 27a ("one"), 27b ("zero") obtained from the sample values and the decision threshold is shown on the axis of the expression of the digital signal 20c against the time axis at the receiver 21b. It can be seen that the digital signal drops off abruptly from a logical one 27a to a logic zero 27b.

The time interval between the timepoint at which the signal intersects the mean amplitude 26a at the transmitter 22 and the timepoint at which the digital signal changes state from one 27a to zero 27b is illustrated as a double arrow 30b.

It can be seen that, depending on the location and samplings of the sample values 25 of the signal 22a, different deviations exist between the double arrows 30a and 30b that limit the accuracy of the transit time measurement.

In the fifth coordinate system of FIG. 2, which again shows the time axis at the receiver 21b and the amplitude axis at the receiver 20b, the sample values 25 are shown again like in the third coordinate system of FIG. 2. Here, however, it is illustrated how, according to the invention, a more accurate transit time measurement can be produced from a sample value 31: With knowledge of the signal characteristic 22 at the transmitter, it is possible to determine the timepoint 29b at which this value 28 of the sample value was given in the signal 22. This is illustrated by the dotted arrow between the fifth and first coordinate system.

The time interval between the time 29b, at which the value 28 of the sample was given in the signal 22 at the transmitter, and the timepoint of the sampling of the sample value 31 with the value 28—illustrated by double arrow 30c—provides a very accurate measurement of the signal transit time between transmitter and receiver.

This analysis can be repeated for all sample values in the edge, which thus lie between the first and the second value and thus, in particular, are repeated in this example for the sample value before sample value 31 and for the sample value after sample value 31. This makes it possible to achieve a substantial further increase in accuracy, for example by averaging the results.

A further increase in accuracy can be achieved by flattening the edge, as indicated in the dotted signal 23 in the first coordinate system, but also by increasing the sampling rate and the resolution of the samples (bit depth); however, the accuracy can be further increased by carrying out the method at a plurality or multiplicity of edges of the signal. The principle can be readily applied to a phase and/or frequency edge.

Figure 3:
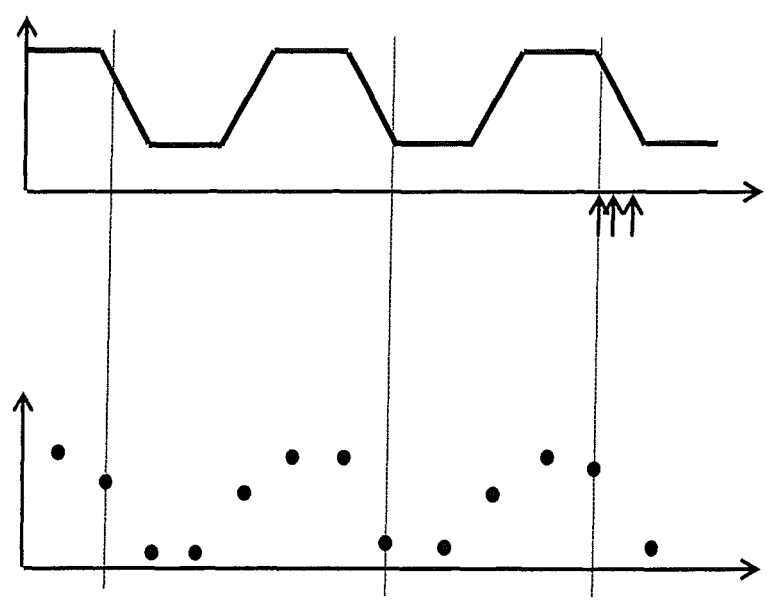
FIG. 3 shows an illustration of the aggregation of measured values from different symbol periods.

In the upper portion of FIG. 3, a signal of a digital data transmission system is shown which alternates between two states, e.g., 0 and 1, with intervening edges. In the lower portion, measured values (samples) of the upper signal are shown as thick dots. For the purpose of clarifying the position in the upper signal, dashed lines are led into the upper portion at the measuring points lying in a falling edge. The position of the measurement points, taken at the successive falling edges in the symbol or chip period, is illustrated by three arrows in the upper portion. It can be seen that, by virtue of the staggered sampling of the signal at different timepoints of the symbol or chip period in relation to the three falling edges, for example, the repeating falling edge can be captured in very high temporal resolution.

LIST OF REFERENCE SYMBOLS 1 antenna
2 transmission amplifier
3 input amplifier
NF low-frequency signal
4 mixer
HF high-frequency signal
5 bandpass filter
6 analog-to-digital converter
7 demodulator
8 error correction and encoder and decoder
9 package handler
10 input FiFo memory
11 interface driver
12 input
13 phase shifter
14 frequency synthesizer
15 modulator
16 input FiFo memory
20 amplitude axis transmitter
20a amplitude axis receiver
20b sample value axis receiver
20c axis of the digital signal
21a time axis at the transmitter
21b time axis at the receiver
22 analog signal
22a analog signal
23 analog signal
24 timepoint of the mean amplitude at the transmitter
24b timepoint of the mean amplitude at the receiver
24c timepoint of the measurement below the decision threshold
25 measured value
26a mean amplitude
26b decision threshold
27a digital signal "1"
27b digital signal "0"
28 value in an edge
29a measuring time of the amplitude at the receiver
29b time of the measured amplitude at the transmitter
30a time interval between transmission and reception
30b time interval between transmission and timepoint of the measurement below the decision threshold
30c measured time interval
31 sampling on edge
32 edge

The invention claimed is:

1. A method for analyzing a temporal position or phase relationship of at least one first analog signal or second analog signal for transit time measurement, phase measurement, or synchronization in a transmission system, said method comprising:
transmitting the at least one first analog signal from a first object to a second object with a frequency bandwidth of 50 MHz of less, or the at least one second analog signal generated on the basis of the at least one first analog signal from the first object to the second object with a frequency bandwidth of 50 MHz or less;
using at least one first sample value of the at least one first analog signal or second analog signal at the second object to determine the temporal position or phase relationship of the at least one first analog signal at the second object; or
using the at least one first sample value of the at least one first analog signal or second analog signal at the second object to carry out an action as a function of the temporal position of the at least one first analog signal or second analog signal at the second object at a first reference time in or at the second object by determining from the at least one first sample value of the at least one first analog signal or second analog signal at the second object which lies in a rising or falling edge of the at least one first analog signal or second analog signal together with at least approximate knowledge of a characteristic of the rising or falling edge in the at least one first analog signal or second analog signal, the position of the at least one first sample value in the at least one first analog signal or second analog signal or the phase relationship of the at least one first analog signal or second analog signal, and hence the temporal position of the at least one first analog signal at the second object.

2. The method as set forth in claim 1, wherein the transmission system is a bidirectional data transmission system, and wherein the method further comprises:
transmitting with the bidirectional data transmission system at least one second piece of information in at least one second object analog signal in encoded form from the second object to the first object;
using at least one first sample value of the at least one second object analog signal at the first object to determine the temporal position or phase relationship by determining from the at least one first sample value of the at least one second object analog signal, which lies in the rising or falling edge of the at least one second object analog signal, together with the at least approximate knowledge of the characteristic of the rising or falling edge in the at least one second object analog signal at the first object or the second object, the temporal position of the at least one first sample value in the at least one second object analog signal and hence the temporal position of the second analog signal at a second reference time or the first reference time or to carry out an action as a function of the temporal position of the at least one second analog signal.

3. The method as set forth in claim 2, further comprising:
determining a first signal transit time or a first phase shift of the at least one first analog signal from the first object to the second object or a second signal transit time or a second phase shift of the at least one second object analog signal from the second object to the first object or a round-trip signal transit time or a round-trip phase shift of the at least one first analog signal and of the at least one second analog signal from the first object via the second object to the first object.

4. The method as set forth in claim 3, further comprising:
determining a distance between the first object and the second object from or using the first signal transit time or the second signal transit time or the first phase shift or the second phase shift or the round-trip signal transit time or the round-trip phase shift.

5. The method as set forth in claim 1, further comprising:
communicating the characteristic of the edge of the at least one first analog signal or second analog signal from the first object to the second object or vice versa; or communicating the temporal position or phase relationship of the second analog signal at the first object from the first object and to the second object; or communicating the temporal position or phase relationship of the first analog signal at the second object from the second object and to the first object; or communicating a timepoint of an emission of the at least one first analog signal or second analog signal or a time interval between a reception or sampling of the at least one first analog signal or second analog signal at the second object; or reception or sampling of the at least one second object analog signal at the first object from the first object to the second object or from the second object to the first object.

6. The method as set forth in claim 1, wherein a resolution of the at least one first sample value or a second sample value or of at least one sample value of the at least one first analog signal or second analog signal is 12 bits or more.

7. The method as set forth in claim 1, wherein a first sampling rate or second sampling rate is at least 1.8 times a symbol rate of the at least one first analog signal or second analog signal.

8. The method as set forth in claim 1, wherein a first sampling or second sampling rate is at least 1.8 times a chip rate of the at least one first analog signal and/or or second analog signal.

9. The method as set forth in claim 1, wherein a plurality of first samplings of the at least one first analog signal or second analog signal are carried out and used or the characteristic of the edge of the at least one first analog signal or second analog signal, resolution, or a bit depth of a first sampling of the at least one first analog signal or second analog signal are selected such that, over the course of the edge of the at least one first analog signal or second analog signal, at least two samplings are carried out which have different sample values.

10. The method as set forth in claim 1, further comprising:
repeating the method at least n times using at least n different combinations of first objects and second objects, with a uniform or dedicated object being involved in all combinations at each of the n combinations as the first object or the second object and the other being selected from the first object and the second object of the combination from a set of n objects such that each of then objects represents the first object or the second object in at least one of the at least n repetitions of the method or n combinations.

11. The method as set forth in claim 10, wherein, in all of the at least n repetitions, the method is additionally carried out between the respective first object of the respective repetition and the second object, which is uniform or dedicated for all repetitions and the determined temporal positions of the at least one first analog signal are made available and processed at a reference time in or at the second object, which is uniform or dedicated for all repetitions, or at a common location, or the one common location is the second object, which is uniform or dedicated for all repetitions.

12. A method for securing an access system including an authorization means and an access control means, wherein the method comprises:
transmitting signals electrically, magnetically, or electromagnetically between the authorization means and the access control means;
determining a signal transit time, a round-trip signal transit time, or a distance between the authorization means and the access control means by the method of claim 1 and, in the event of an overshoot of the predetermined signal transit time or the round-trip signal transit time or the predetermined distance, or in the event of an overshoot of a predetermined deviation of the determined temporal position or phase relationship that was predetermined or calculated by other methods, access, egress, or opening is denied by the access control means.

13. A transmission system comprising:
means for analyzing a temporal position or phase relationship of at least one first analog signal or second analog signal with respect to transit time measurement, phase measurement, or synchronization;
wherein the transmission system has at least two objects and is configured to transmit at least one first piece of information in at least one first analog signal in encoded form or in at least one second analog signal generated on the basis of the at least one first analog signal between the at least two objects;
wherein the transmission system is configured to take at least one first sample value of the at least one first analog signal or second analog signal after the transmission between the at least two objects in a rising or falling edge of the at least one first analog signal and to use this to determine a temporal position or phase relationship of the at least one first analog signal or second analog signal from the at least one first sample value together with at least approximate knowledge of a characteristic of the edge in the at least one first analog signal or second analog signal at a first object or a second object of the at least two objects, the temporal position of the at least one first analog signal at the second object, and hence the temporal position of the at least one first analog signal at a reference time in the second object, or to carry out an action as a function of the temporal position of the at least one first analog signal or second analog signal as an emission of a first response signal from the second object, such that a relationship exists between the temporal position or phase relationship of the at least one first analog signal that is predetermined or communicated in the transmission system.

14. A transmission system comprising:
a use of at least one first sample value of at least one first analog signal obtained by means of at least one first analog-to-digital converter for a time-resolved detection of a position of the at least one first analog signal relative to a reference time or to initiate or carry out an action as a function of a temporal position of the at least one first analog signal, wherein the at least one first sample value of the at least one first analog signal lies in a rising or falling edge of the at least one first analog signal, and knowledge of a characteristic of the rising or falling edge in the at least one first analog signal is used to determine the temporal position of the at least one first sample value in the at least one first analog signal and thereby the temporal position of the at least one first analog signal at the reference time or to carry out or initiate the action as the function of the temporal position of the at least one first analog signal as an emission of a first response signal such that a predetermined or communicated relationship exists between the temporal position or phase relationship of the at least one first analog signal and the first response signal.

15. The transmission system as set forth in claim 14, wherein the use further comprises:

generating the at least one first analog signal at a first object and transmitting therefrom by means of electromagnetic, electrical, or magnetic signals to a second object and the at least one first sample value is determined at the second object and a first reference time is a time at the second object or an initiation or execution of the action occurs at the second object and the first response signal is emitted from the second object and the temporal relationship between the temporal position of the at least one first analog signal at the second object and the first response signal at the second object is given.

* * * * *